United States Patent
Tanaka et al.

[11] Patent Number: 5,354,734
[45] Date of Patent: Oct. 11, 1994

[54] METHOD FOR MANUFACTURING AN ARTIFICIAL GRAIN BOUNDARY TYPE JOSEPHSON JUNCTION DEVICE

[75] Inventors: So Tanaka; Michitomo Iiyama, both of Osaka, Japan

[73] Assignee: Sumitomo Electric Industries, Ltd., Osaka, Japan

[21] Appl. No.: 986,493

[22] Filed: Dec. 7, 1992

[30] Foreign Application Priority Data

Dec. 6, 1991 [JP] Japan .................. 3-348968
Nov. 27, 1992 [JP] Japan .................. 4-341196

[51] Int. Cl.$^5$ .................. H01B 12/00; H01L 39/12
[52] U.S. Cl. .................. 505/329; 505/702; 156/630
[58] Field of Search .................. 156/630; 505/701, 702, 505/729, 730, 731, 732, 832

[56] References Cited

U.S. PATENT DOCUMENTS

| | | | |
|---|---|---|---|
| 5,034,374 | 7/1991 | Awaji et al. | 505/701 |
| 5,162,298 | 11/1992 | Chaudhari et al. | 505/1 |
| 5,252,390 | 10/1993 | Takada et al. | 505/702 |

*Primary Examiner*—Tom Thomas
*Attorney, Agent, or Firm*—Kerkam, Stowell, Kondracki & Clarke

[57] ABSTRACT

A portion of a sufficiently thick insulating layer formed on a substrate is removed so that a recessed device region is formed and surrounded by masking wall portions left at both ends of the recessed device region. A first oxide superconducting thin film is deposited at angle of 30° to the substrate so as to ensure that a c-axis oriented oxide superconducting thin film grows in such a way that a portion of the recessed device region is masked by one of the masking wall portions so that no thin film grows over the masked portion of the recessed device region. Then, another oxide superconducting thin film is deposited at angle of −30° to the substrate so as to ensure that an a-axis oriented oxide superconducting thin film grows in such a way that another portion of the recessed device region is masked by the other of the masking wall portions, so that no thin film grows over the masked portion, but the a-axis oriented oxide superconducting thin film is in contact with the c-axis oriented oxide superconducting thin film, with the result that a grain boundary functioning a weak link is formed between the a-axis oriented oxide superconducting thin film and the c-axis oriented oxide superconducting thin film.

7 Claims, 1 Drawing Sheet

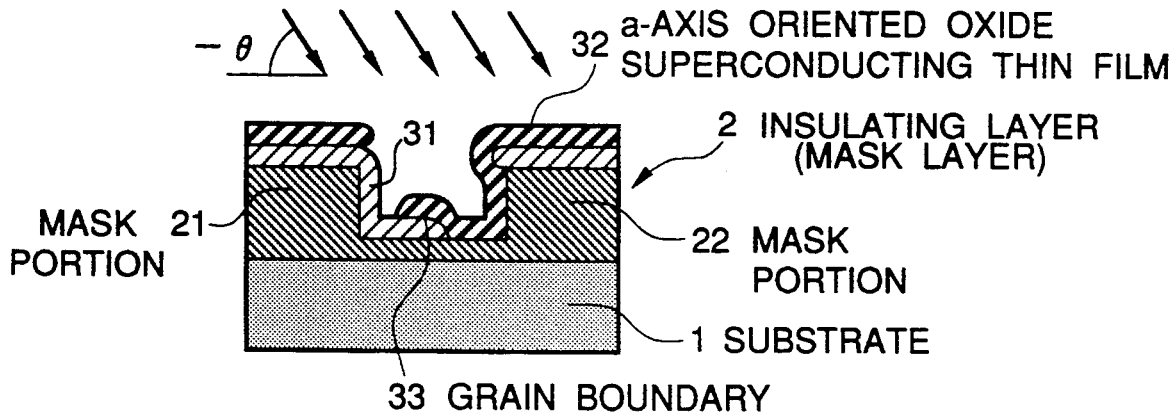

FIGURE 1A

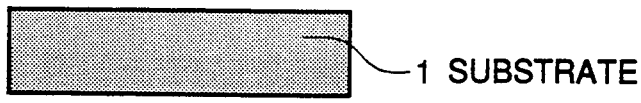
1 SUBSTRATE

FIGURE 1B

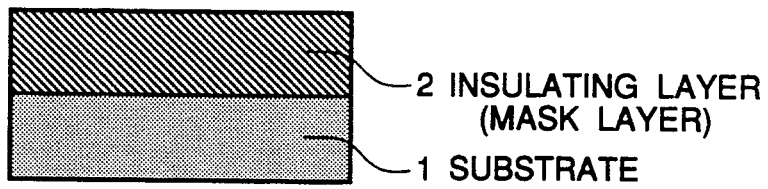
2 INSULATING LAYER (MASK LAYER)
1 SUBSTRATE

FIGURE 1C

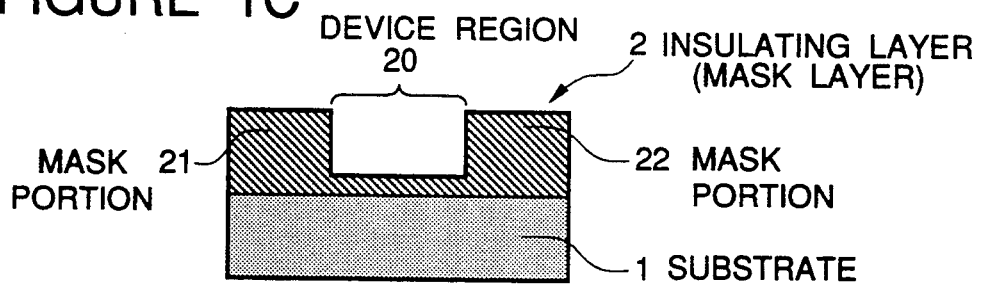
DEVICE REGION 20
2 INSULATING LAYER (MASK LAYER)
MASK 21 PORTION
22 MASK PORTION
1 SUBSTRATE

FIGURE 1D

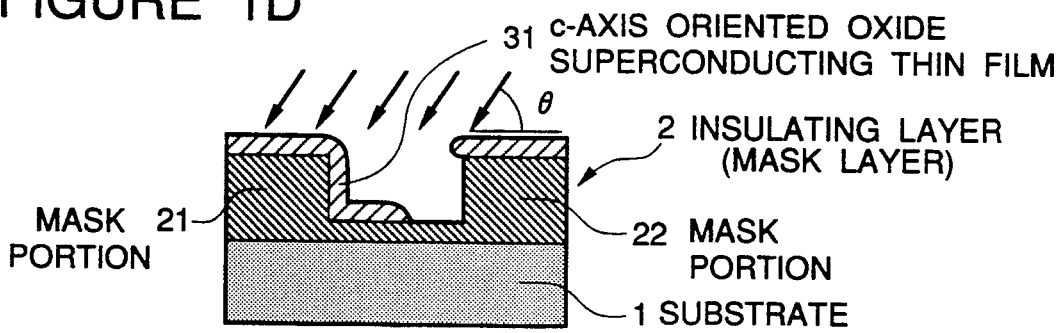
31 c-AXIS ORIENTED OXIDE SUPERCONDUCTING THIN FILM
θ
2 INSULATING LAYER (MASK LAYER)
MASK 21 PORTION
22 MASK PORTION
1 SUBSTRATE

FIGURE 1E

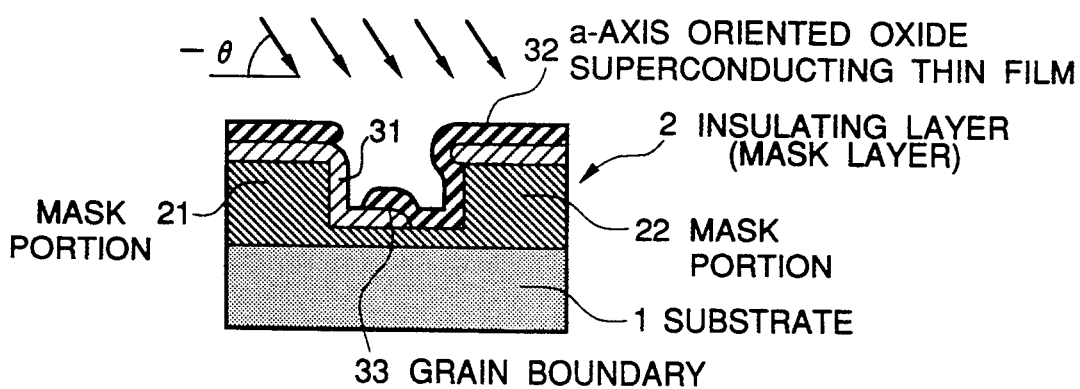
−θ
32 a-AXIS ORIENTED OXIDE SUPERCONDUCTING THIN FILM
31
2 INSULATING LAYER (MASK LAYER)
MASK 21 PORTION
22 MASK PORTION
1 SUBSTRATE
33 GRAIN BOUNDARY

METHOD FOR MANUFACTURING AN ARTIFICIAL GRAIN BOUNDARY TYPE JOSEPHSON JUNCTION DEVICE

BACKGROUND OF THE INVENTION

1. Field of the Invention

The present invention relates to a method for manufacturing an artificial grain boundary type Josephson junction device. More specifically, the present invention relates to a novel method for preparing an artificial grain boundary type Josephson junction device formed of an oxide superconducting thin film.

2. Description of Related Art

A Josephson junction device can be realized in various structures. Among the various structures, the most preferable structure in practice is a stacked junction realized by a thin insulating layer sandwiched between a pair of superconductors. However, Josephson junction devices, which are composed of a pair of superconductor regions weakly linked to each other by for example a point contact type junction, a Dayem bridge type junction, also exhibit Josephson effect, although they show different characteristics. In general, these Josephson junctions have fine structures in which the superconductor and/or the insulator are composed of thin films.

In order to realize, for example, a stacked type Josephson junction device by using an oxide superconductor, a first oxide superconducting thin film, an insulator thin film and a second oxide superconducting thin film are stacked on a substrate in the named order.

The thickness of the insulating layer of the stacked type Josephson junction device is determined by the coherence length of the superconductor. Since the coherence length of an oxide superconductor is very short, the thickness of the insulating layer must be about a few nanometers in the stacked type Josephson junction device formed of the oxide superconductor.

Further, both of the point contact type Josephson junction device and the Dayem bridge type Josephson junction device require a very fine processing such as a fine etching and a fine patterning, which makes it possible to realize a weak link between a pair of superconductors.

On the other hand, considering the operation characteristics of the Josephson junction device, each of the layers constituting the Josephson junction device has to have a high crystallinity and to be composed of a single crystal or a polycrystal having an orientation very close to that of a single crystal.

In the above mentioned stacked type Josephson junction device, therefore, it is necessary to stack a first oxide superconducting thin film, an insulator thin film and a second oxide superconducting thin film, which are of high crystallinity, respectively. However, it is difficult to stack an extremely thin and high crystalline insulator thin film on an oxide superconducting thin film. Furthermore, it is very difficult to stack a high crystalline oxide superconducting thin film on this insulator thin film because of the characteristics of the oxide superconductor.

Further, although the above mentioned stacked structure was realized, the interface between the oxide superconductor and the insulator was not in a good condition, so that a desired characteristics could not be obtained.

On the other hand, it is very difficult to conduct a fine processing such as a fine etching and a fine patterning on an oxide superconductor, which permits it to realize a point contact type Josephson junction device or a Dayem bridge type Josephson junction device. Therefore, a Josephson junction device using an oxide superconductor and having a stable performance could not be produced with good repeatability.

In view of the above mentioned problems, researches have been conducted for manufacturing a Josephson junction device taking advantage of the characteristics intrinsic to the oxide superconductor, while reducing the fine processing, such as a fine etching and a fine patterning, of the oxide superconductor to a possible extent. The oxide superconductor has a considerably different superconducting characteristics, dependently upon its crystalline direction. For example, if oxide superconductors having a crystalline direction different from each other are joined together, a grain boundary formed at the junction interface constitutes a barrier, so that a Josephson junction is formed. A Josephson junction device using this Josephson junction is called a artificial grain boundary type Josephson junction device, and can be manufactured without the fine processing as mentioned above.

As an example of the above mentioned artificial grain boundary type Josephson junction device, there may be mentioned a device formed by a junction between a c-axis oriented oxide superconducting thin film having its c-axis of crystal perpendicular to the substrate and another oxide superconducting thin film having its c-axis of crystal in parallel to the substrate (called "a-axis oriented oxide superconducting thin film" for the clarity of the description in this specification).

However, in order to manufacture a Josephson junction device comprising the artificial grain boundary having the structure as mentioned above, it is necessary to effect a processing of, for example, physically patterning a previously formed oxide superconducting thin film. In the course of this processing, the oxide superconducting thin film is exposed to the atmosphere so as to be degraded, with the result that an unnecessary Josephson junction is formed and/or a sharp grain boundary cannot be formed. Therefore, no process for manufacturing a Josephson junction device having a desired characteristics with good repeatability has been established yet.

SUMMARY OF THE INVENTION

Accordingly, it is an object of the present invention to provide a method for manufacturing an artificial grain boundary type Josephson junction device, which has overcome the above mentioned defect of the conventional one.

Another object of the present invention is to provide a method for manufacturing an artificial grain boundary type Josephson junction device, which can realize an excellent characteristics with good repeatability.

The above and other objects of the present invention are achieved in accordance with the present invention by a method for manufacturing an artificial grain boundary type Josephson junction device which includes a substrate, a first superconducting region composed of a c-axis oriented oxide superconducting thin film which is deposited on the substrate and which has its c-axis of crystal perpendicular to the substrate, and a second superconducting region composed of an oxide superconducting thin film which is formed on the substrate in contact with the first superconducting region and which has its c-axis of crystal in parallel to the substrate, so that a weak link is constituted at an interface between the first and second superconducting regions, the method comprising the steps of;

forming a sufficiently thick insulating layer on a principal surface of a substrate;

removing a part of the insulating layer to form a recessed device region surrounded by wall portions having a sufficient height from a bottom of the device region, respectively;

depositing a first oxide superconducting thin film on the insulating layer, under the condition that a c-axis oriented oxide superconducting thin film having its c-axis perpendicular to the principal surface of the substrate grows, and from a first upper oblique direction of the substrate that a first end of opposite ends of the device region is masked by a first one of the wall portions so that no thin film grows in the masked first end of the device region; and depositing a second oxide superconducting thin film on the insulating layer, under the condition that an oxide superconducting thin film having its c-axis in parallel to the principal surface of the substrate grows, and from a second upper oblique direction of the substrate that a second end of opposite ends of the device region is masked by the other one of the wall portions so that no thin film grows in the masked second end of opposite ends of the device region but the second oxide superconducting thin film partially overlaps the first oxide superconducting thin film so that a grain boundary is formed at an interface between the first oxide superconducting thin film and the second oxide superconducting thin film.

The method in accordance with the present invention for manufacturing an artificial grain type Josephson junction device is essentially characterized in that an oxide superconducting thin film is deposited obliquely after forming a three-dimensional mask on the substrate, so that a crystalline grain boundary, which will constitute a barrier in the Josephson junction device, can be formed without a processing such as a fine etching and a fine patterning of the oxide superconducting thin film. According to the methods of the prior art, the processing such as the etching and the fine patterning of the oxide superconducting thin film have been effected by any means after depositing the thin film, in order to form a crystalline grain boundary. Therefore, the oxide superconducting thin film could have been degraded, particularly in the neighborhood of the junction interface in the course of the processing.

According to the method of the present invention, the processing such as the etching and the patterning of the oxide superconducting thin film is no longer necessary in order to form a crystalline grain boundary, and the Josephson junction can be formed only by effecting the deposition operation from an upper oblique direction of the substrate after formation of a three-dimensional mask. Further, it is possible to successively effect a series of processes without destroying a vacuum in a deposition room. Thus, the surface of the thin film is not exposed to the atmosphere in the course of the manufacturing process, so that the surface of the thin film and the substrate are not degraded.

It is possible to control the crystalline orientation of the oxide superconducting thin film by varying a substrate temperature in the deposition process. In the case of a typical $Y_1Ba_2Cu_3O_{7-x}$ oxide superconducting thin film, an a-axis oriented film is deposited when the substrate temperature in the deposition process is relatively low, for example, less than 650° C., while a c-axis oriented film is deposited when the substrate temperature in the deposition process is relatively high, for example, not less than 650° C. However, if the substrate temperature in the deposition process is higher than 750° C., the amount of oxygen included in the oxide superconductor crystals is decreased and the superconducting properties are largely degraded.

As mentioned above, the substrate temperature in the course of depositing a c-axis oriented thin film is higher than that in the course of depositing an a-axis oriented thin film. Thus, in the method of the present invention, it is preferred to first deposit a c-axis oriented thin film and then to deposit an a-axis oriented thin film. If an a-axis oriented thin film is first deposited and thereafter a c-axis oriented thin film is formed, there is a risk of losing the superconductivity of the a-axis oriented thin film previously formed. In addition, on an a-axis oriented thin film, an a-axis oriented thin film (not a c-axis oriented thin film) is apt to be easily grown regardless of the substrate temperature.

In the method of the present invention, the above mentioned insulating layer can be formed of any insulator, such as MgO or $SrTiO_3$, having a low reactivity with oxide superconductor. More particularly, it is preferably formed of $Pr_1Ba_2Cu_3O_{7-y}$, since $Pr_1Ba_2Cu_3O_{7-y}$ is a non-superconducting oxide which is constituted by substituting Pr for Y of the $Y_1Ba_2Cu_3O_{7-x}$ oxide superconductor and which has a crystalline structure almost identical to that of the oxide superconductor. Thus, even if $Pr_1Ba_2Cu_3O_{7-y}$ oxide is in contact with an oxide superconductor, not only it gives no adverse effect on the oxide superconductor, but also a portion of the oxide superconducting thin film in contact with the $Pr_1Ba_2Cu_3O_{7-y}$ layer may show an improved superconductivity if the oxide superconductor layer and a $Pr_1Ba_2Cu_3O_{7-y}$ layer are stacked.

The method of the present invention having the above mentioned features can be generally applied to the manufacture of an artificial grain type Josephson junction device. The oxide superconductor thin film is preferably formed of a high-$T_c$ (high critical temperature) oxide superconductor, more preferably, formed of a high-$T_c$ copper-oxide type compound oxide superconductor. As particularly preferable superconducting material. $Y_1Ba_2Cu_3O_{7-x}$, $Bi_2Sr_2Ca_2Cu_3O_x$, $Tl_2Ba_2Ca_2Cu_3O_x$, etc. can be exemplified.

As the substrate material, a MgO(100) substrate, a $SrTiO_3$(110) substrate, a YSZ substrate, etc. can preferably used. However, it is not limited to these substrates. For example, a silicon substrate having an appropriate buffer layer on its deposition surface can be used.

The above and other objects, features and advantages of the present invention will be apparent from the following description of preferred embodiments of the invention with reference to the accompanying drawings.

BRIEF DESCRIPTION OF THE DRAWINGS

FIGS. 1A to 1E are diagrammatic sectional views illustrating various steps of one embodiment of the process in accordance with the present invention for manufacturing an artificial grain boundary type Josephson junction device.

DESCRIPTION OF THE PREFERRED EMBODIMENT

An embodiment of the process in accordance with method of the present invention for manufacturing an artificial grain boundary type Josephson junction device will be explained with reference to FIGS. 1A to 1E.

First, as shown in FIG. 1A, a MgO(100) substrate is prepared. In this embodiment, a MgO(100) substrate having a size of 15 mm×8 mm and a thickness of 0.5 mm was used. Then, as shown in FIG. 1B, a $Pr_1Ba_2Cu_3O_{7-y}$ thin film was deposited on this substrate 1 by a sputtering process so as to form a mask layer 2. The conditions for the sputtering process were as follows:

| Substrate temperature | 750° C. |
| --- | --- |
| Sputtering gases | |
| Ar | 9 sccm (90%) |
| $O_2$ | 1 sccm (10%) |
| Pressure | $5 \times 10^{-2}$ Torr |
| Thickness of film | 700 nm |

Thereafter, as shown in FIG. 1C, a portion of the mask layer 2 was removed by an ion milling process using Ar ions so as to form a recessed device region 20 having a width of 1.5 μm and a depth of 0.5 μm in a center portion of the substrate. Namely. the recessed device region has a depth-to-length ratio of 1:3. But, the depth-to-length ratio of the recessed device region is not limited to 1:3. The recessed device region 20 is surrounded by masking wall portions 21 and 22 formed at opposite ends of the device region 20, respectively. In this embodiment, this processing was effected in such a way that the $Pr_1Ba_2Cu_3O_{7-y}$ layer was slightly left on a bottom surface of the device region 20 and in the following step, an oxide superconducting thin film was deposited on the $Pr_1Ba_2Cu_3O_{7-y}$ thin film. As a patterning process of the above mentioned mask layer 2, a RIE process or another method can be also used in place of the ion milling process using the Ar gas.

After the above mentioned processing, the substrate was maintained under ultra-high vacuum of about $1 \times 10^{-9}$ Torr at a temperature of about 350° to 400° C. for an hour so as to clean up the surface of the $Pr_1Ba_2Cu_3O_{7-y}$ thin film of the device region 20. Thereafter, as shown in FIG. 1D, a c-axis oriented $Y_1Ba_2Cu_3O_{7-x}$ oxide superconducting thin film 31 was deposited by a sputtering process from an oblique upper direction at angle $\theta$ of 30° to the deposition surface of the substrate 1. The conditions for the deposition process were as follows:

| Substrate Temperature | 700° C. |
| --- | --- |
| Sputtering gases | |
| Ar | 9 sccm (90%) |
| $O_2$ | 1 sccm (10%) |
| Pressure | $5 \times 10^{-2}$ Torr |
| Thickness of film | 250 nm |

In this process, a c-axis oriented $Y_1Ba_2Cu_3O_{7-x}$ oxide superconducting thin film 31 grows, on an upper surface and a side surface of the masking wall portion 21 which are not in shadow of the masking wall portion 22, on an upper surface of the masking wall portion 22 and on a portion of the device region 20.

Then, as shown in FIG. 1E, an a-axis oriented $Y_1Ba_2Cu_3O_{7-x}$ oxide superconducting thin film was deposited by a sputtering process from an oblique upper direction at angle $\theta$ of $-30°$ to the deposition surface of the substrate 1. The conditions for the deposition process were as follows:

| Substrate Temperature | 640° C. |
| --- | --- |
| Sputtering gases | |
| Ar | 9 sccm (90%) |
| $O_2$ | 1 sccm (10%) |
| Pressure | $5 \times 10^{-2}$ Torr |
| Thickness of film | 250 nm |

In this process, the a-axis oriented $Y_1Ba_2Cu_3O_{7-x}$ oxide superconducting thin film 32 grows, on the upper surface and a side surface of the masking wall portion 22 which are not in shadow of the masking wall portion 21, on the upper surface of the masking wall portion 21 and on a portion of the device region 20. In a region in the neighborhood of the center of the device region 20, the a-axis oriented $Y_1Ba_2Cu_3O_{7-x}$ oxide superconducting thin film 32 and the c-axis oriented $Y_1Ba_2Cu_3O_{7-x}$ oxide superconducting thin film 31 were stacked so that a crystal grain boundary 33 is formed.

In the above mentioned embodiment, the substrate 1 was continuously subjected to the processing in a deposition chamber where a vacuum was maintained, without being taken out from the deposition chamber, from the start of the deposition of the c-axis oriented $Y_1Ba_2Cu_3O_{7-x}$ oxide superconducting thin film 31 to the end of the deposition of the a-axis oriented $Y_1Ba_2Cu_3O_{7-x}$ oxide superconducting thin film 32.

When the artificial grain boundary type Josephson device manufactured as mentioned above was cooled by means of liquid nitrogen and a microwave was applied, the AC Josephson effect could be observed.

As explained above, according to the present invention, it is possible to easily manufacture an artificial grain boundary type Josephson junction device composed of an oxide superconductor, without using either the etching or the patterning of the oxide superconductor. In accordance with the method of the present invention, it is possible to continuously deposit a c-axis oriented oxide superconducting thin film and an a-axis oriented oxide superconducting thin film, while maintaining the vacuum, so as to form a Josephson junction. Therefore, it is possible to manufacture a Josephson junction device which can be applied to various sensors and circuit devices, since a desired performance is exactly realized.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing an artificial grain boundary type Josephson junction device, said device comprising a substrate, a first superconducting region comprising a c-axis oriented superconducting thin film deposited on the substrate and having its c-axis perpendicular to the substrate, and a second superconducting region comprising a c-axis superconducting thin film formed on the substrate having its c-axis parallel to the substrate, said second superconducting region being in contact with the first superconducting region, forming a weak link at an interface between said first and second superconducting regions, the method comprising the steps of:

forming an insulating layer on a principal surface of a substrate;

removing a portion of said insulating layer to form a recessed device region surrounded by first and second wall portions, said first and second wall portions forming a three dimensional mask on the substrate, wherein said first wall portion masks a first end of said device region and said second wall portion masks a second end of said device region;

obliquely depositing a first oxide superconducting thin film on said insulating layer at a first upper oblique angle to the principal surface of said substrate, wherein the first end of said device region is masked by the first wall portion and no thin film grows in said masked first end of said device region, said first oxide thin film being a c-axis oriented thin film having its c-axis perpendicular to the principal surface of said substrate; and obliquely depositing a second oxide superconducting thin film on said insulating layer at a second upper oblique angle to the principal surface of said substrate, wherein the second end of said device region is masked by the second wall portion and no thin film grows in said masked second end of said device region, said second oxide superconducting thin film partially overlapping said first oxide superconducting thin film and forming a grain boundary at an interface between said first oxide superconducting thin film and said second oxide superconducting thin film, said second oxide thin film being a c-axis oriented thin film having its c-axis parallel to the principal surface of said substrate.

2. The method claimed in claim 1, wherein said first upper oblique angle is inclined to said principal surface of said substrate at an angle of 30°, and said second upper oblique angle is inclined to said principal surface of said substrate at an angle of $-30°$.

3. The method claimed in claim 2, wherein said recessed device region has a depth-to-length ratio of 1:3.

4. The method in claim 1, wherein said insulating layer comprises a material selected from the group consisting of MgO, $SrTiO_3$ and $Pr_1Ba_2Cu_3O_{7-y}$.

5. The method claimed in claim 1, wherein each of said first and second oxide superconductor thin films comprises a high-$T_c$ (high critical temperature) oxide superconductor.

6. The method claimed in claim 5 wherein each of said first and second oxide superconductor thin films comprises a high-$T_c$ copper-oxide superconductor.

7. The method claimed in claim 6 wherein each of said first and second oxide superconductor thin films comprises an oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

* * * * *